(12) United States Patent
Hashimoto

(10) Patent No.: US 11,333,693 B2
(45) Date of Patent: May 17, 2022

(54) FREQUENCY MEASUREMENT APPARATUS, MICROCONTROLLER, AND ELECTRONIC APPARATUS

(71) Applicant: SEIKO EPSON CORPORATION, Tokyo (JP)

(72) Inventor: Keisuke Hashimoto, Chino (JP)

(73) Assignee: SEIKO EPSON CORPORATION, Tokyo (JP)

( * ) Notice: Subject to any disclaimer, the term of this patent is extended or adjusted under 35 U.S.C. 154(b) by 0 days.

(21) Appl. No.: 17/354,354

(22) Filed: Jun. 22, 2021

(65) Prior Publication Data

US 2021/0405099 A1 Dec. 30, 2021

(30) Foreign Application Priority Data

Jun. 24, 2020 (JP) .............................. JP2020-108578

(51) Int. Cl.
| | |
|---|---|
| *G01R 23/00* | (2006.01) |
| *G01R 23/10* | (2006.01) |
| *H03K 21/02* | (2006.01) |
| *H03K 21/40* | (2006.01) |
| *H03K 5/135* | (2006.01) |

(52) U.S. Cl.
CPC ............. *G01R 23/10* (2013.01); *H03K 5/135* (2013.01); *H03K 21/02* (2013.01); *H03K 21/40* (2013.01)

(58) Field of Classification Search
None
See application file for complete search history.

(56) References Cited

U.S. PATENT DOCUMENTS

| | | | | |
|---|---|---|---|---|
| 5,874,949 | A * | 2/1999 | Furukawa | ............... G09G 1/16 345/213 |
| 6,611,785 | B1 * | 8/2003 | Yamanaka | ............ G01F 1/3209 702/155 |
| 10,114,053 | B2 * | 10/2018 | Zhai | ...................... G01R 23/10 |
| 2003/0117181 | A1 | 6/2003 | Powell et al. | |
| 2009/0251129 | A1 * | 10/2009 | Todorokihara | ......... G01R 23/10 324/76.39 |
| 2021/0063451 | A1 * | 3/2021 | Takahashi | .............. G01R 23/10 |

FOREIGN PATENT DOCUMENTS

| | | |
|---|---|---|
| JP | 03-027787 | 2/1991 |
| JP | 05-060808 | 3/1993 |
| JP | 05-302940 | 11/1993 |
| JP | 05-322943 | 12/1993 |
| JP | 07-012861 | 1/1995 |
| JP | 08-094660 | 4/1996 |
| JP | 2005-009916 | 1/2005 |
| JP | 2005-514604 | 5/2005 |
| WO | 03/056348 | 7/2003 |

* cited by examiner

*Primary Examiner* — Tuan T Lam
(74) *Attorney, Agent, or Firm* — Rankin, Hill & Clark LLP

(57) ABSTRACT

A frequency measurement apparatus includes: a measurement period setting circuit that sets a measurement period based on a reference clock signal; a first counter circuit that counts the number of pulses of the reference clock signal in a period based on an input signal during the measurement period; a second counter circuit that counts the number of pulses of the input signal during the measurement period; a first frequency calculation circuit that calculates a first frequency; a second frequency calculation circuit that calculates a second frequency; and a frequency selection circuit that selects the first frequency or the second frequency as a frequency of the input signal.

10 Claims, 8 Drawing Sheets

FREQUENCY MEASUREMENT APPARATUS, MICROCONTROLLER, AND ELECTRONIC APPARATUS

The present application is based on, and claims priority from JP Application Serial Number 2020-108578, filed Jun. 24, 2020, the disclosure of which is hereby incorporated by reference herein in its entirety.

BACKGROUND

1. Technical Field

The present disclosure relates to a frequency measurement apparatus, a microcontroller, and an electronic apparatus.

2. Related Art

A direct counting method and a reciprocal counting method are known as methods of measuring a frequency of an input signal by using a reference clock signal. The direct counting method is a method of directly measuring the frequency of the input signal by counting the number of pulses of the input signal in a measurement period corresponding to a predetermined period of the clock signal. The direct counting method has an advantage that the higher the frequency of the input signal, the smaller the maximum measurement error, but in other words, has a defect that the lower the frequency of the input signal, the larger the maximum measurement error. Even when the frequency of the input signal is low, the measurement error can be reduced by lengthening the measurement period. Meanwhile, a time required for measurement becomes long.

On the other hand, the reciprocal counting method is a method in which the number of pulses of a clock signal in a measurement period corresponding to a predetermined period of an input signal is counted, a time of one period of the input signal is measured, and a frequency of the input signal is indirectly measured by using a reciprocal number of the time. The reciprocal counting method has an advantage that the lower the frequency of the input signal, the smaller the maximum measurement error, but in other words, has a defect that the higher the frequency of the input signal, the larger the maximum measurement error. Even when the frequency of the input signal is high, the measurement error can be reduced by lengthening the measurement period. Meanwhile, a time required for measurement becomes long.

Therefore, in both the direct counting method and the reciprocal counting method, there is a problem that a measurable range of the frequency of the input signal is limited. In order to solve such a problem, JP-A-2005-9916 describes a frequency measurement apparatus configured to widen a frequency measurement range, by switching between a direct counting method and a reciprocal counting method according to a frequency of an input signal.

Meanwhile, in the frequency measurement apparatus described in JP-A-2005-9916 described above, it is necessary to switch between two types of clock signals depending on the frequency of the input signal. Therefore, there is a problem that a circuit of the measurement apparatus becomes complicated and a cost of the apparatus is increased.

SUMMARY

A frequency measurement apparatus according to an aspect of the present disclosure measures a frequency of an input signal, and the apparatus includes: a measurement period setting circuit that sets a measurement period of the frequency of the input signal based on a reference clock signal; a first counter circuit that counts the number of pulses of the reference clock signal in a period based on the input signal during the measurement period; a second counter circuit that counts the number of pulses of the input signal during the measurement period; a first frequency calculation circuit that calculates a first frequency $f_1$ based on $f_1 = f_R \times n_{IN}/n_R$, where a frequency of the reference clock signal is $f_R$, the number of pulses of the reference clock signal during the measurement period is $n_R$, a count value of the second counter circuit is $n_{IN}$, and a count value of the first counter circuit is $n_E$; a second frequency calculation circuit that calculates a second frequency $f_2$ based on $f_2 = f_R \times n_{IN}/n_E$; and a frequency selection circuit that selects the first frequency $f_1$ or the second frequency $f_2$ as the frequency of the input signal.

A microcontroller according to another aspect of the present disclosure includes: the frequency measurement apparatus according to the aspect.

An electronic apparatus according to still another aspect of the present disclosure includes: the frequency measurement apparatus according to the aspect or the microcontroller according to the other aspect.

DESCRIPTION OF EXEMPLARY EMBODIMENTS

Hereinafter, appropriate embodiments of the present disclosure will be described in detail with reference to the accompanying drawings. The embodiments to be described below do not unfairly limit contents of the present disclosure described in the appended claims. In addition, all of configurations to be described below are not essential components of the disclosure.

1. Frequency Measurement Apparatus

Figure 1:
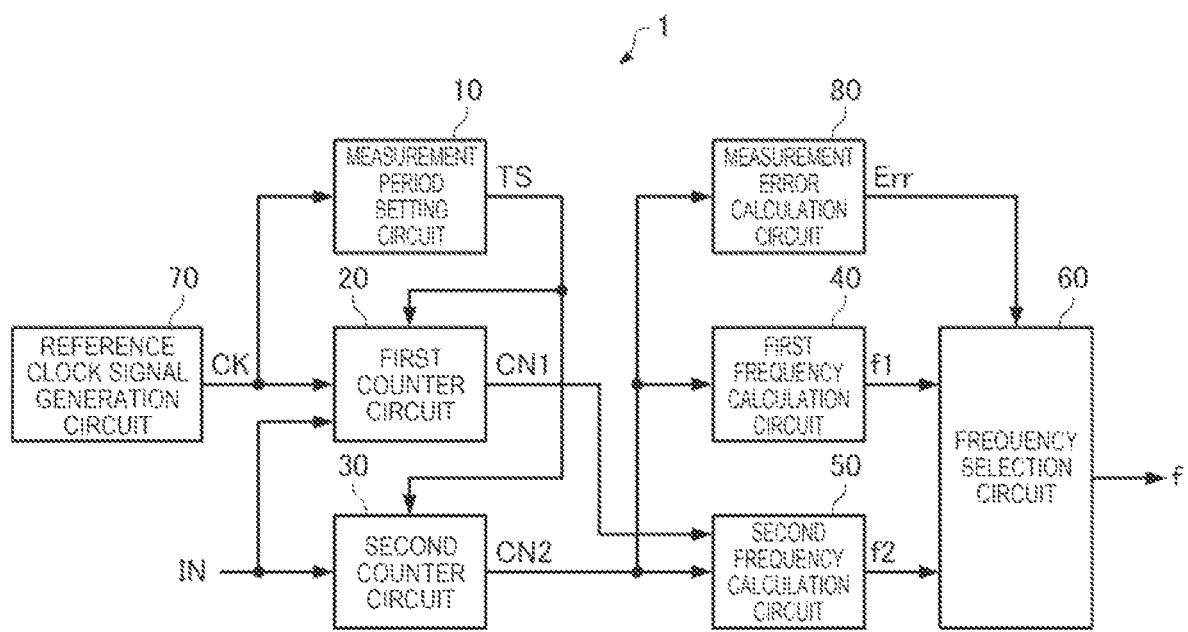
FIG. 1 is a diagram illustrating a configuration of a frequency measurement apparatus according to the present embodiment.

FIG. 1 is a diagram illustrating a configuration of a frequency measurement apparatus according to the present embodiment. As illustrated in FIG. 1, a frequency measurement apparatus 1 according to the present embodiment includes a measurement period setting circuit 10, a first counter circuit 20, a second counter circuit 30, a first frequency calculation circuit 40, a second frequency calculation circuit 50, and a frequency selection circuit to measure a frequency of an input signal IN. The frequency measurement apparatus 1 may be realized by a one-chip integrated circuit such as an application specific integrated circuit (ASIC), may be realized by a plurality of chip integrated circuits, or may include a discrete component.

Based on a reference clock signal CK, the measurement period setting circuit 10 sets a measurement period T of the frequency of the input signal IN, and outputs a measurement period signal TS indicating the measurement period T. In the present embodiment, the number of pulses $n_R$ of the reference clock signal CK during the measurement period T is predetermined. The measurement period setting circuit 10 shifts the measurement period signal TS from a low level to a high level at a predetermined rising edge of the reference clock signal CK, and shifts the measurement period signal TS from the high level to the low level at the next rising edge of the reference clock signal CK when the number of pulses of the reference clock signal CK coincides with $n_R$. The measurement period T is a period during which the measurement period signal TS is at the high level.

The frequency measurement apparatus 1 may have a reference clock signal generation circuit 70 that generates the reference clock signal CK. The reference clock signal CK is a reference clock signal for measuring the frequency of the input signal IN. Therefore, in the present embodiment, the reference clock signal CK is a clock signal having high frequency accuracy, and for example, the reference clock signal generation circuit 70 may oscillate a quartz crystal resonator so as to generate the reference clock signal CK. Further, in the present embodiment, the reference clock signal CK is a clock signal having a relatively low frequency equal to or less than 1 MHz, such as 32.768 kHz, for example. In the following, a frequency of the reference clock signal CK is set to be $f_R$. The measurement period T is expressed by Equation (1) using the frequency $f_R$ of the reference clock signal CK and the number of pulses $n_R$ of the reference clock signal CK during the measurement period T. That is, the measurement period T is a period having a length of $n_R$ times one period of the reference clock signal CK.

$$T = \frac{n_R}{f_R} \quad (1)$$

The first counter circuit 20 counts the number of pulses of the reference clock signal CK, during a period T' based on the input signal IN during the measurement period T. For example, the period T' may be a period between a first rising edge and a last rising edge of the input signal IN during the measurement period T, or may be a period between a first falling edge and a last falling edge of the input signal IN during the measurement period T. In the following, a count value CN1 of the first counter circuit 20, that is, the number of pulses of the reference clock signal CK in the period T' is defined as $n_E$.

The second counter circuit 30 counts the number of pulses of the input signal IN during the measurement period T. In the following, a count value CN2 of the second counter circuit 30, that is, the number of pulses of the input signal IN during the measurement period T is defined as $n_{IN}$.

The first frequency calculation circuit 40 calculates a first frequency $f_1$ based on Equation (2). The first frequency $f_1$ is a frequency obtained by a frequency measurement method in which the number of pulses $n_{IN}$ of the input signal IN during the measurement period $T = n_R/f_R$ having a length of $n_R$ times one period of the reference clock signal CK is counted, and the frequency of the input signal IN is measured. Since the measurement period T corresponds to the $n_R$ period of the reference clock signal CK and $n_R$ is a predetermined constant value as described above, this frequency measurement method has the same manner as the direct counting method described above.

$$f_1 = f_R \times \frac{n_{IN}}{n_R} \quad (2)$$

The second frequency calculation circuit 50 calculates a second frequency $f_2$ based on Equation (3). The second frequency $f_2$ is a frequency obtained by a period measurement method in which the number of pulses $n_E$ of the reference clock signal CK during the period T' of counting the number of pulses of the input signal IN during the measurement period T $n_{IN}$ times is counted and a time of one period of the input signal IN is measured, and the frequency of the input signal IN is measured by using a reciprocal number of the time. This period measurement method has the same manner as the reciprocal counting method described above in that the period of the input signal IN is measured. Meanwhile, in the reciprocal counting method described, the time of one period of the input signal IN is measured, and in the period measurement method, the time which is not limited to one period of the input signal IN is measured. That is, the number of pulses $n_{IN}$ of the input signal IN is different from the reciprocal counting method described above in that the number of pulses $n_{IN}$ of the input signal IN is changed depending on the frequency of the input signal IN.

$$f_2 = \frac{1}{\frac{1}{f_R} \times \frac{n_E}{n_{IN}}} = f_R \times \frac{n_{IN}}{n_E} \quad (3)$$

The frequency selection circuit 60 selects the first frequency $f_1$ or the second frequency $f_2$ as a frequency f of the input signal IN.

The frequency measurement apparatus 1 may have a measurement error calculation circuit 80. The measurement error calculation circuit 80 calculates a measurement error Err, based on the count value CN2 of the second counter circuit 30, that is, the number of pulses $n_{IN}$ of the input signal IN during the measurement period T. In the present embodiment, the measurement error Err is a maximum error Err1 of the first frequency $f_1$, and is calculated based on Equation (4).

$$Err = Err1 = \frac{f_R \times (\pm 1)}{f_R \times \frac{n_{IN}}{n_R}} = \pm \frac{1}{n_{IN}} \quad (4)$$

In the present embodiment, the frequency selection circuit 60 selects the first frequency $f_1$ or the second frequency $f_2$, based on the measurement error Err calculated by the measurement error calculation circuit 80, as the frequency f of the input signal IN. Specifically, the frequency selection circuit 60 selects the first frequency $f_1$ when an absolute value of the measurement error Err is equal to or less than a predetermined threshold value VTE, and selects the second frequency $f_2$ when the absolute value of the measurement error Err is larger than the threshold value VTE.

Here, a maximum error Err2 of the second frequency $f_2$ is expressed by Equation (5).

$$Err2 = \frac{f_R \times \frac{n_{IN}}{n_R} - f_R \times \frac{n_{IN}}{n_R \pm 1}}{f_R \times \frac{n_{IN}}{n_R}} = 1 - \frac{n_R}{n_R \pm 1} = \pm \frac{\pm 1}{n_R \pm 1} \quad (5)$$

Here, since the number of pulses $n_R$ of the reference clock signal CK during the measurement period T is predetermined, the maximum error Err2 of the second frequency $f_2$ is a constant value regardless of the frequency of the input signal IN. Therefore, when the absolute value of the measurement error Err is smaller than an absolute value of the maximum error Err2, accuracy of the first frequency $f_1$ is higher than accuracy of the second frequency $f_2$, and when the absolute value of the measurement error Err is larger than the absolute value of the maximum error Err2, the accuracy of the second frequency $f_2$ is higher than the accuracy of the first frequency $f_1$. Therefore, for example, by setting the threshold value VTE as the absolute value of the maximum error Err2, the frequency selection circuit 60 can select one of the first frequency $f_1$ and the second frequency $f_2$ having the higher accuracy as the frequency f. Here, the threshold value VTE may be other than the absolute value of the maximum error Err2. For example, for simplicity, the threshold value VTE may be a constant close to the maximum error Err2.

The processing of the first frequency calculation circuit 40, the second frequency calculation circuit 50, and the frequency selection circuit 60 may be performed with hardware by a logic circuit. In this manner, the frequency measurement apparatus 1 can calculate the first frequency $f_1$ and calculate the second frequency $f_2$, and select the first frequency $f_1$ or the second frequency $f_2$ at high speed. Alternatively, the processing of the first frequency calculation circuit 40, the second frequency calculation circuit 50, and the frequency selection circuit 60 may be performed with software by a central processing unit (CPU). In this manner, the frequency measurement apparatus 1 can easily change the methods of calculating the first frequency $f_1$ and calculating the second frequency $f_2$, and selecting the first frequency $f_1$ or the second frequency $f_2$.

Figure 2:
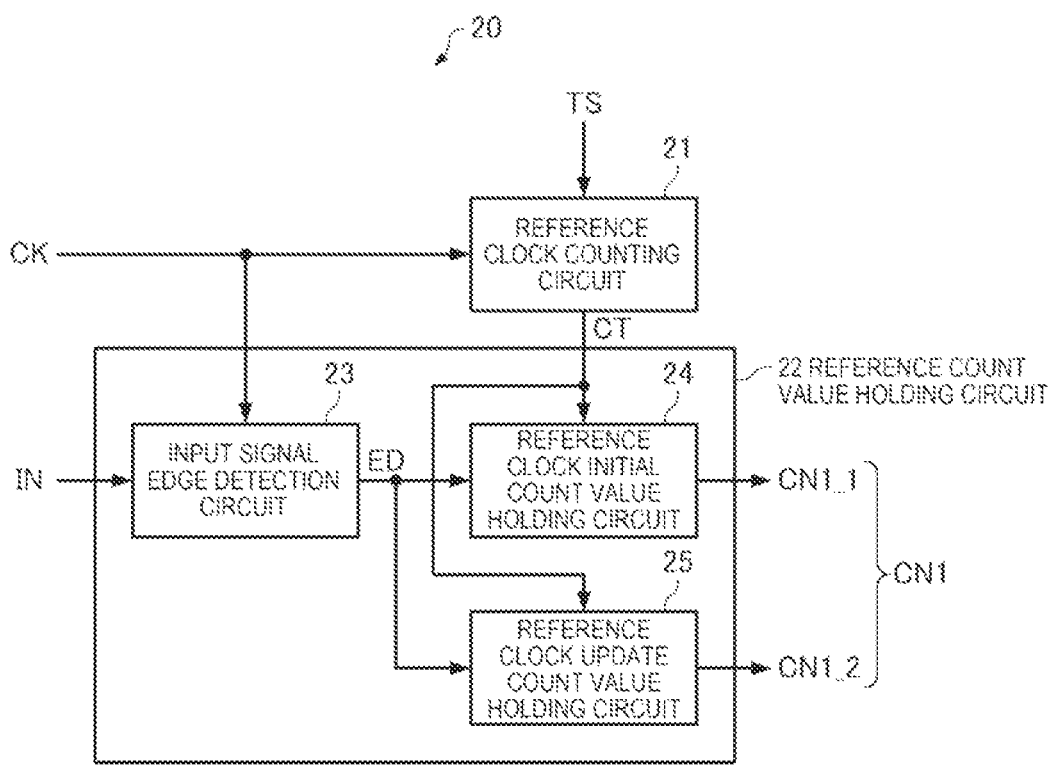
FIG. 2 is a diagram illustrating a specific configuration example of a first counter circuit.

FIG. 2 is a diagram illustrating a specific configuration example of the first counter circuit 20. As illustrated in FIG. 2, the first counter circuit 20 includes a reference clock counting circuit 21 and a reference count value holding circuit 22.

The reference clock counting circuit 21 counts the number of pulses of the reference clock signal CK in the measurement period T indicated by the measurement period signal TS, and outputs a count value CT.

In the measurement period T, the reference count value holding circuit 22 samples the input signal IN with the reference clock signal CK to detect a rising edge or a falling edge of the input signal IN, and holds the count value CT, which is the number of pulses of the reference clock signal CK from a start time of the measurement period T to a detection time of the rising edge or falling edge of the input signal IN.

In the present embodiment, the reference count value holding circuit 22 includes an input signal edge detection circuit 23, a reference clock initial count value holding circuit 24, and a reference clock update count value holding circuit 25.

In the measurement period T, the input signal edge detection circuit 23 samples the input signal IN with the reference clock signal CK, detects the rising edge or the falling edge of the input signal IN, and outputs an edge detection signal ED. In the present embodiment, the edge detection signal ED is a signal which transitions from a low level to a high level at a time of detecting the rising edge or the falling edge of the input signal IN, and transitions from the high level to the low level one period after the reference clock signal CK.

The reference clock initial count value holding circuit 24 holds the count value CT for a first high level period of the edge detection signal ED in the measurement period T, as a count value CN1_1.

The reference clock update count value holding circuit 25 holds the count value CT of the edge detection signal ED for second and subsequent high level periods in the measurement period T, as a count value CN1_2. The count value CN1_2 is updated to the latest count value CT each time the edge detection signal ED becomes a high level.

Therefore, assuming that the count value CN1_1 at an end of the measurement period T is $n_{E1}$ and the count value CN1_2 is $n_{E2}$, a difference between $n_{E2}$ and $n_{E1}$ corresponds to the number of pulses $n_E$ of the reference clock signal CK in the period T' from the first rising edge or the first falling edge to the last rising edge or the last falling edge of the input signal IN, in the measurement period T. Therefore, by substituting $n_E = n_{E2} - n_{E1}$ into the above Equation (3), Equation (6) is obtained. The second frequency calculation circuit 50 may calculate the second frequency $f_2$ based on Equation (6).

$$f_2 = f_R \times \frac{n_{IN}}{n_{E2} - n_{E1}} \quad (6)$$

The count value CN1_1 and the count value CN1_2 correspond to the count value CN1 in FIG. 1. Further, when the count value CN1_1 is a fixed value, the reference clock initial count value holding circuit 24 is not essential. In this case, the count value CN1_2 corresponds to the count value CN1 in FIG. 1.

Figure 3:
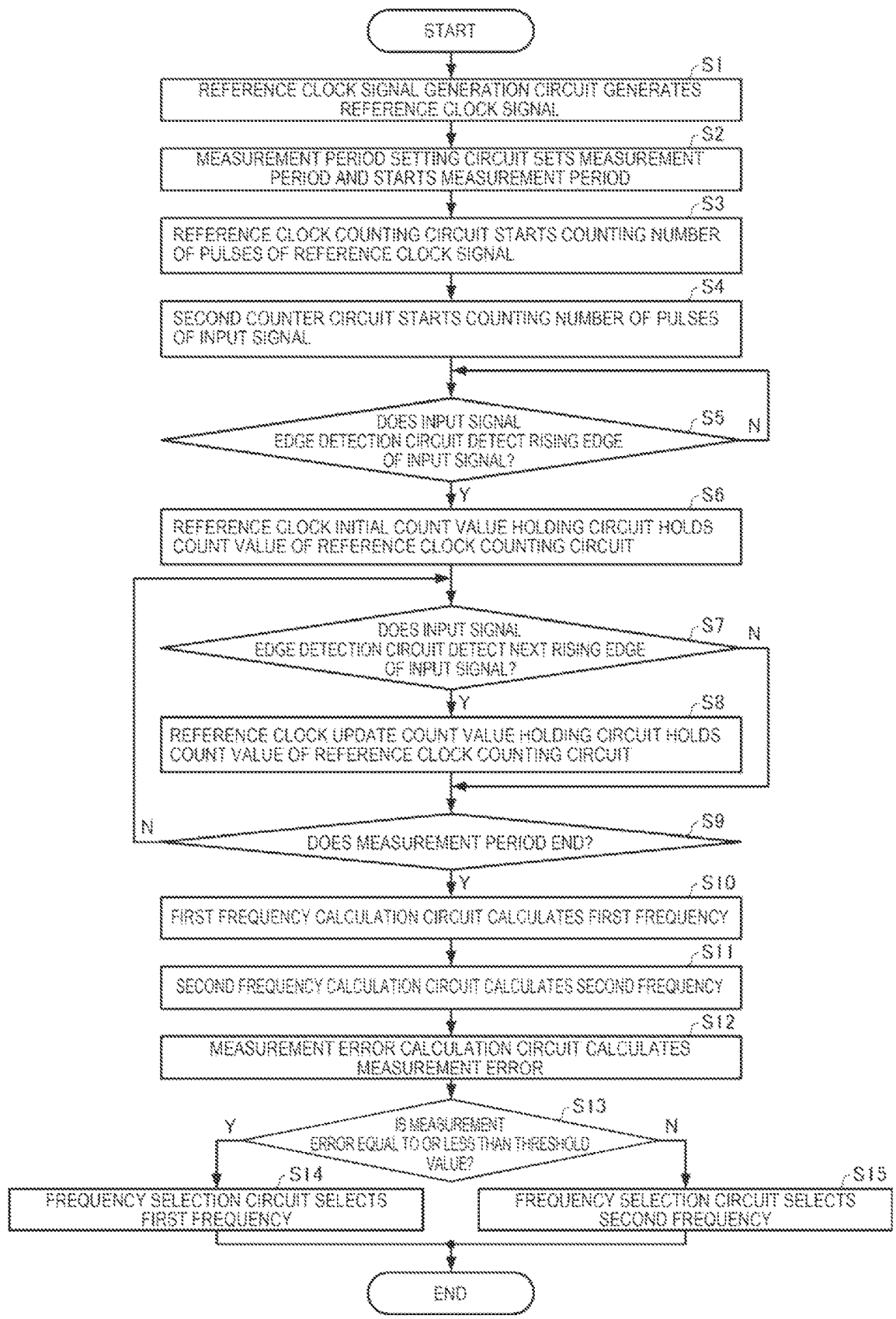
FIG. 3 is a flowchart illustrating an example of an operation procedure of the frequency measurement apparatus.

FIG. 3 is a flowchart illustrating an example of an operation procedure of the frequency measurement apparatus 1. As illustrated in FIG. 3, first, the reference clock signal generation circuit 70 generates the reference clock signal CK (step S1).

Next, the measurement period setting circuit 10 sets the measurement period T and starts the measurement period T (step S2).

Next, the reference clock counting circuit 21 of the first counter circuit 20 starts counting the number of pulses of the reference clock signal CK (step S3).

Next, the second counter circuit 30 starts counting the number of pulses of the input signal IN (step S4).

Next, the process waits until the input signal edge detection circuit 23 of the first counter circuit 20 detects the rising edge of the input signal IN (N in step S5). When the input signal edge detection circuit 23 detects the rising edge of the input signal IN (Y in step S5), the reference clock initial count value holding circuit 24 of the first counter circuit 20 holds the count value CT of the reference clock counting circuit 21, as the count value CN1_1 (step S6).

Next, until the measurement period T ends (N in step S9), each time the input signal edge detection circuit 23 detects the next rising edge of the input signal IN (Y in step S7), the reference clock update count value holding circuit 25 of the first counter circuit 20 holds the count value CT of the reference clock counting circuit 21, as the count value CN1_2 (step S8).

When the measurement period T ends (Y in step S9), the first frequency calculation circuit 40 calculates the first frequency $f_1$ based on Equation (2) by using the count value CN2 of the second counter circuit 30 as $n_{IN}$, and by using the frequency $f_R$ of the reference clock signal CK and the number of pulses $n_R$ of the reference clock signal CK during the measurement period T (step S10).

Next, the second frequency calculation circuit 50 calculates the second frequency $f_2$ based on Equation (6) by using the count value CN1_1 as $n_{E1}$ and the count value CN1_2 as $n_{E2}$ (step S11).

Next, the measurement error calculation circuit 80 calculates the measurement error Err based on Equation (4) (step S12).

Finally, when the measurement error Err is equal to or less than the threshold value VTE (Y in step S13), the frequency selection circuit 60 selects the first frequency $f_1$ as the frequency f of the input signal IN (step S14), and when the measurement error Err is larger than the threshold value VTE (N in step S13), the frequency selection circuit 60 selects the second frequency $f_2$ as the frequency f of the input signal IN (step S15).

Figure 4:
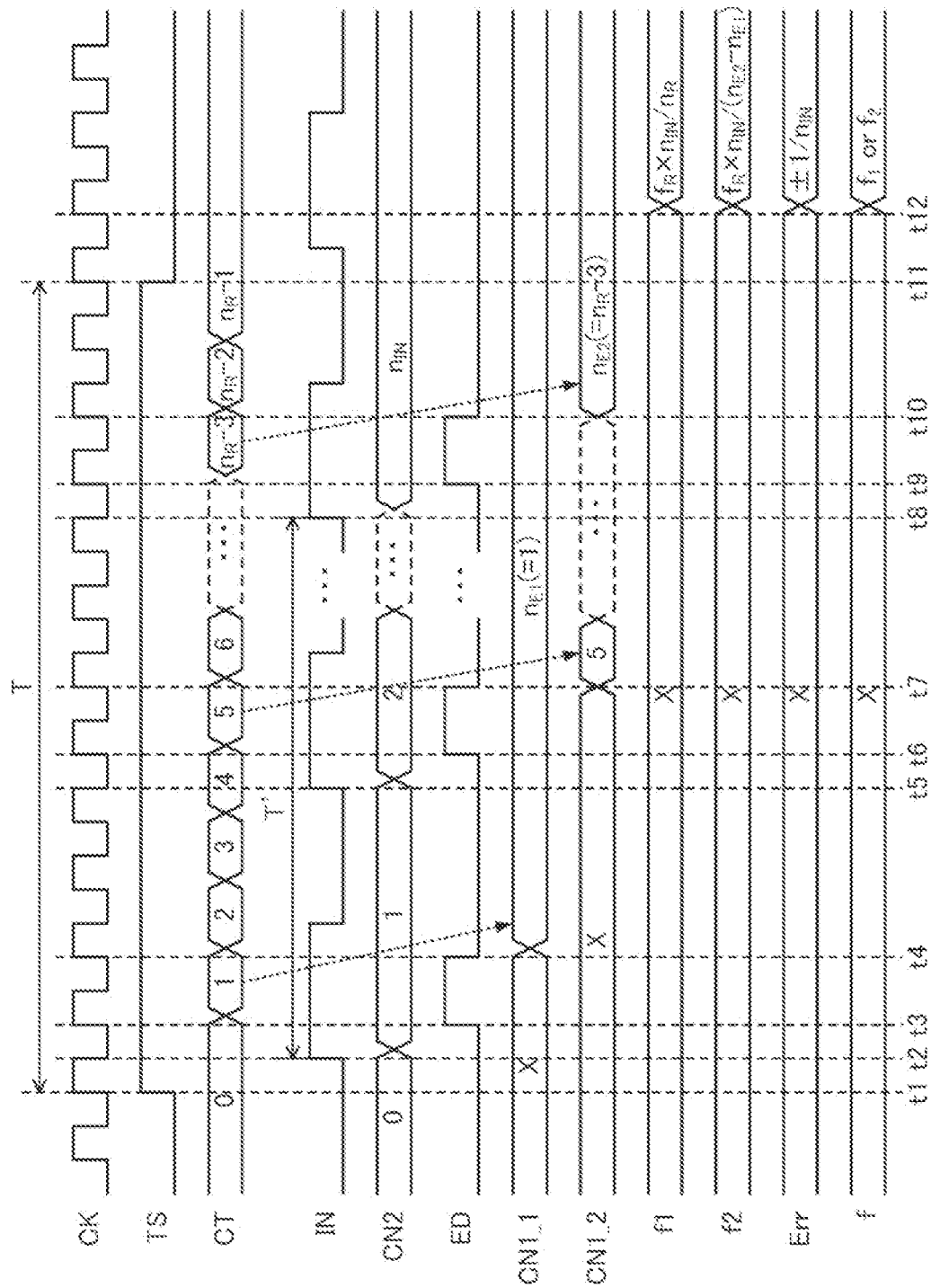
FIG. 4 is a timing chart illustrating an example of waveforms of various signals in the frequency measurement apparatus.

FIG. 4 is a timing chart illustrating an example of waveforms of various signals in the frequency measurement apparatus 1.

In the example in FIG. 4, first, at a time t1, the measurement period signal TS transitions from a low level to a high level, and the measurement period T starts. In the measurement period T, the count value CT of the number of pulses of the reference clock signal CK is incremented by 1 from 0 for each rising edge of the reference clock signal CK.

At a time t2, the input signal IN transitions from the low level to the high level. The count value CN2 changes from 0 to 1 in synchronization with a rising edge of the input signal IN. Further, the edge detection signal ED transitions from the low level to the high level, in synchronization with a rising edge of the reference clock signal CK at a time t3.

Since the edge detection signal ED is at the high level at a time t4, the count value CN1_1 is updated to 1, which is the count value CT, in synchronization with a rising edge of the reference clock signal CK.

At a time t5, the input signal IN transitions from the low level to the high level. The count value CN2 changes from 1 to 2 in synchronization with the rising edge of the input signal IN. Further, the edge detection signal ED transitions from the low level to the high level, in synchronization with a rising edge of the reference clock signal CK at a time t6.

Since the edge detection signal ED is at the high level at a time t7, the count value CN1_2 is updated to 5, which is the count value CT, in synchronization with the rising edge of the reference clock signal CK.

After that, until a time t8, in the same manner as the time t5 to the time t7, each time the input signal IN transitions from the low level to the high level, the count value CN2 is incremented by 1, in synchronization with the rising edge of the input signal IN, and the count value CN1_2 is updated to the count value CT, in synchronization with a rising edge of the reference clock signal CK.

At the time t8, the input signal IN transitions from the low level to the high level. The count value CN2 is changed from $n_{IN}-1$ to $n_{IN}$, in synchronization with the rising edge of the input signal IN. Further, the edge detection signal ED transitions from the low level to the high level, in synchronization with a rising edge of the reference clock signal CK at a time t9.

Since the edge detection signal ED is at the high level at a time t10, the count value CN1_2 is updated to $n_R-3$, which is the count value CT, in synchronization with a rising edge of the reference clock signal CK.

Since the count value CT is $n_R-1$ at a time t11, the measurement period signal TS transitions from the high level to the low level, and the measurement period T ends. The $n_{IN}$, which is the count value CN2 at the time t11, corresponds to the number of pulses of the input signal IN in the measurement period T. Further, when 1 which is the count value CN1_1 at the time t11 is $n_{E1}$ and $n_R-3$ which is the count value CN1_2 at the time t11 is $n_{E2}$, $n_{E2}-n_{E1}$ corresponds to the number of pulses of the reference clock signal CK in the period T' from the time t2 to the time t8.

At a time t12, in synchronization with a rising edge of the reference clock signal CK, the first frequency $f_1$ is calculated based on the above Equation (2), the second frequency $f_2$ is calculated based on the above Equation (6), and the measurement error Err is calculated based on the above Equation (4). The first frequency $f_1$ or the second frequency $f_2$ is selected as the frequency f of the input signal IN based on the measurement error Err.

As described above, in the frequency measurement apparatus 1 according to the present embodiment, based on the reference clock signal CK, the measurement period setting circuit 10 sets the measurement period T of the frequency f of the input signal IN, the first counter circuit 20 counts the number of pulses $n_E$ of the reference clock signal CK of the period T' based on the input signal IN during the measurement period T, and the second counter circuit 30 counts the number of pulses $n_{IN}$ of the input signal IN during the measurement period T. Further, when the frequency of the reference clock signal CK is set as $f_R$ and the number of pulses of the reference clock signal CK during the measurement period T is set as $n_R$, the first frequency calculation circuit 40 calculates the first frequency $f_1$ based on the above Equation (2), the second frequency calculation circuit 50 calculates the second frequency $f_2$ based on the above Equation (3), and the frequency selection circuit 60 selects the first frequency $f_1$ or the second frequency $f_2$ as the frequency f of the input signal IN.

That is, the frequency measurement apparatus 1 according to the present embodiment calculates the first frequency $f_1$ by the frequency measurement method, calculates the second frequency $f_2$ by the period measurement method, and selects the first frequency $f_1$ or the second frequency $f_2$ as the frequency of the input signal IN, so that it is possible to widen a frequency measurement range. Further, with the frequency measurement apparatus 1 according to the present embodiment, the reference clock signal CK is commonly used for the calculation of the first frequency $f_1$ by the frequency measurement method and the calculation of the second frequency $f_2$ by the period measurement method, so that it is possible to reduce a cost without the need for a plurality of clock signals.

Further, with the frequency measurement apparatus 1 according to the present embodiment, the measurement error calculation circuit 80 calculates the measurement error Err by Equation (4) based on the number of pulses $n_{IN}$ of the input signal IN during the measurement period T counted by the second counter circuit 30, and the frequency selection circuit 60 selects the first frequency $f_1$ or the second frequency $f_2$ as the frequency of the input signal IN based on the measurement error Err. Specifically, the frequency selection circuit 60 selects the first frequency $f_1$ when an absolute value of the measurement error Err is equal to or less than the predetermined threshold value VTE, and selects the second frequency $f_2$ when the absolute value of the measurement error Err is larger than the threshold value VTE. Therefore, with the frequency measurement apparatus 1 according to the present embodiment, by appropriately setting the threshold value VIE, the frequency selection circuit 60 can select one having the smaller measurement error of the first frequency $f_1$ and the second frequency $f_2$, it is possible to measure the frequency f of the input signal IN with high accuracy.

2. Microcontroller

Figure 5:
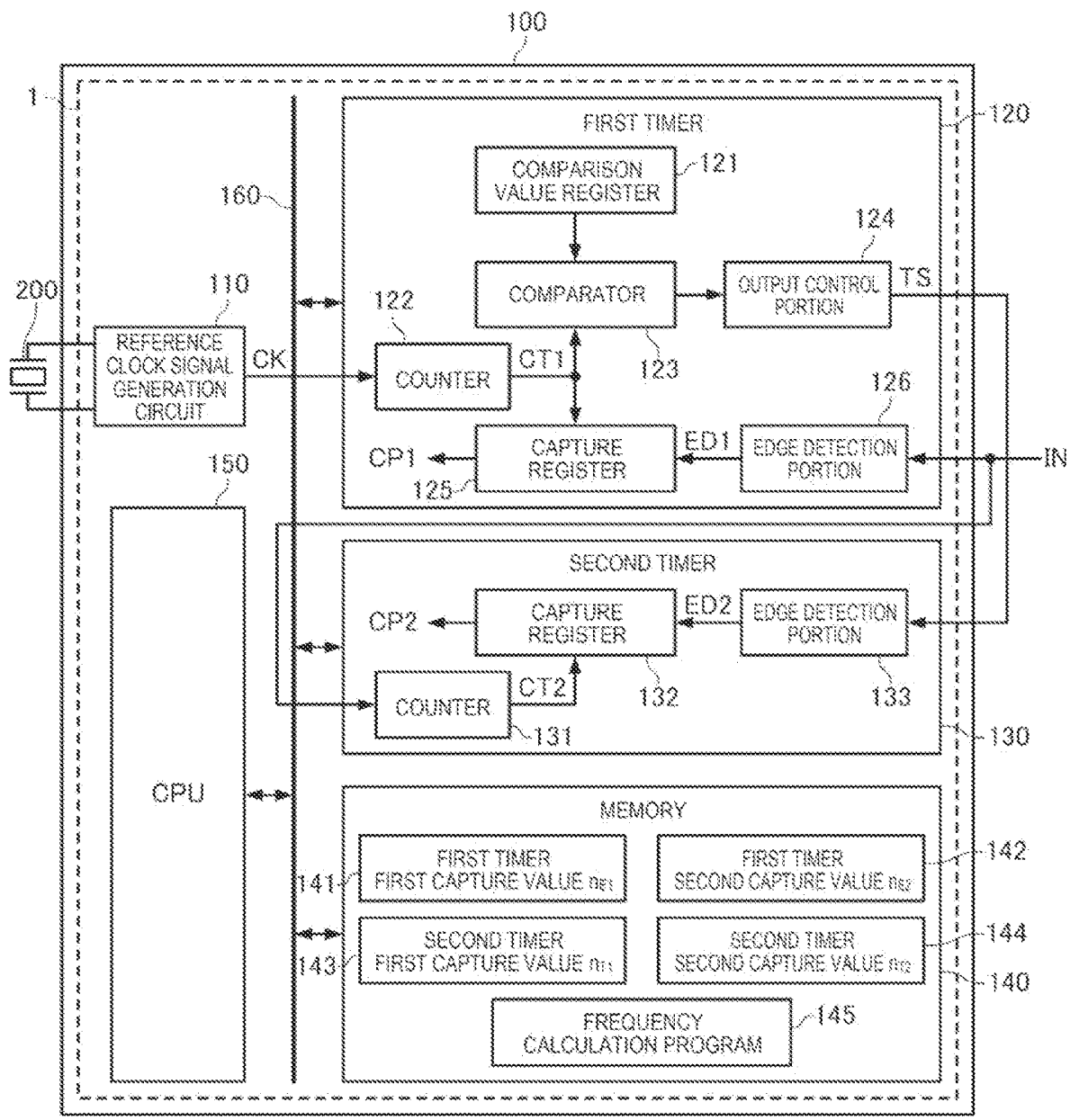
FIG. 5 is a diagram illustrating a configuration of a microcontroller according to the present embodiment.

FIG. 5 is a diagram illustrating a configuration of a microcontroller according to the present embodiment. As illustrated in FIG. 5, a microcontroller 100 according to the present embodiment includes a reference clock signal generation circuit 110, a first timer 120, a second timer 130, a memory 140, and a central processing unit (CPU) 150. The first timer 120, the second timer 130, the memory 140, and the CPU 150 are coupled to the bus 160. The microcontroller 100 may not have some of these components, or may have another component.

The reference clock signal generation circuit 110, the first timer 120, the second timer 130, the memory 140, and the CPU 150 function as the frequency measurement apparatus 1 described above. That is, the microcontroller 100 includes the frequency measurement apparatus 1.

The microcontroller 100 is coupled to a resonator 200 such as a quartz crystal resonator, and the reference clock signal generation circuit 110 oscillates the resonator 200 to generate the reference clock signal CK having high frequency accuracy.

The first timer 120 includes a comparison value register 121, a counter 122, a comparator 123, an output control portion 124, a capture register 125, and an edge detection portion 126.

A value for determining the measurement period T described above is set in the comparison value register 121. For example, for the number of pulses $n_R$ of the reference clock signal CK during the measurement period T described above, $n_1 = n_R - 1$ is set in the comparison value register 121.

When the measurement period T starts, the counter 122 resets the value to 0 and counts the number of pulses of the reference clock signal CK.

The comparator 123 compares the count value CT1 of the counter 122 with the value of the comparison value register 121, and outputs a signal indicating whether or not a count value CT1 of the counter 122 and the value of the comparison value register 121 coincide with each other.

The output control portion 124 generates the measurement period signal TS indicating the measurement period T, and outputs the measurement period signal TS to the outside of the microcontroller 100. The output control portion 124 shifts the measurement period signal TS output in synchronization with the reference clock signal CK from a low level to a high level and starts the measurement period T, and shifts the measurement period signal TS from the high level to the low level in synchronization with the reference clock signal CK and ends the measurement period T when the output signal of the comparator 123 indicates that the count value CT1 and the value of the comparison value register 121 coincide with each other.

In the measurement period T, the edge detection portion 126 samples the input signal IN input from the outside of the microcontroller 100 with the reference clock signal CK to detect a rising edge or a falling edge of the input signal IN, and outputs an edge detection signal ED1. In the present embodiment, the edge detection signal ED1 is a signal which transitions from a low level to a high level at a time of detecting the rising edge or the falling edge of the input signal IN, and transitions from the high level to the low level one period after the reference clock signal CK.

When the edge detection signal ED1 is at a high level, the capture register 125 acquires the count value CT1 at the rising edge of the reference clock signal CK, and holds the count value CT1 as a capture value CP1. In the measurement period T, the capture register 125 transfers the capture value CP1 acquired and held during the first high level period of the edge detection signal ED1 to the memory 140 via the bus 160, and stores the capture value CP1 in the memory 140 as a first timer first capture value 141. Further, in the measurement period T, the capture register 125 transfers the capture value CP1 acquired and held in the second and subsequent high level periods of the edge detection signal ED1 to the memory 140 via the bus 160, and stores the capture value CP1 in the memory 140 as a first timer second capture value 142. The first timer second capture value 142 is updated to the latest capture value CP1 each time the edge detection signal ED1 is at the high level.

The second timer 130 has a counter 131, a capture register 132, and an edge detection portion 133.

The counter 131 counts the number of pulses of the input signal IN during the measurement period T.

The edge detection portion 133 samples the measurement period signal TS input from the outside of the microcontroller 100 with the input signal IN, detects a rising edge or a falling edge of the measurement period signal TS, and outputs an edge detection signal ED2. In the present embodiment, the edge detection signal ED2 is a signal which transitions from a low level to a high level at a time of detecting a rising edge or a falling edge of the measurement period signal TS, and transitions from the high level to the low level one period after the input signal IN.

When the edge detection signal ED2 is at the high level, the capture register 132 acquires a count value CT2 of the counter 131 at the rising edge of the input signal IN and holds the count value CT2 as a capture value CP2. After the start of the measurement period T, the capture register 132 transfers the capture value CP2 acquired and held during the first high level period of the edge detection signal ED2 to the memory 140 via the bus 160, and stores the capture value CP2 in the memory 140 as a second timer first capture value 143. Further, the capture register 132 transfers the capture value CP2 acquired and held during the second high level period of the edge detection signal ED2 to the memory 140 via the bus 160, and stores the capture value CP2 in the memory 140 as a second timer second capture value 144.

The CPU 150 executes a frequency calculation program 145 stored in the memory 140, and calculates the frequency f of the input signal IN by a software process. Specifically, first, after the end of the measurement period T, the CPU 150 reads the first timer first capture value 141, the first timer second capture value 142, the second timer first capture value 143, and the second timer second capture value 144, from the memory 140 via the bus 160. Next, when the first timer first capture value 141 is set to $n_{E1}$, the first timer second capture value 142 is set to $n_{E2}$, the second timer first capture value 143 is set to $n_T$, and the second timer second capture value 144 is set to $n_{T2}$, the CPU 150 calculates the first frequency $f_1$ based on the above Equation (2), by using the frequency $f_R$ of the reference clock signal CK and the number of pulses $n_R$ of the reference clock signal CK during the measurement period T, with $n_{IN}=n_{T2}-n_{T1}$. Further, the CPU 150 calculates the second frequency $f_2$ based on the above Equation (6). Further, the CPU 150 calculates the measurement error Err based on the above Equation (4). The CPU 150 selects the first frequency $f_1$ or the second frequency $f_2$ as the frequency f of the input signal IN, based on the measurement error Err. Specifically, the CPU 150 selects the first frequency $f_1$ when an absolute value of the measurement error Err is equal to or less than the predetermined threshold value VTE, and selects the second frequency $f_2$ when the absolute value of the measurement error Err is larger than the threshold value VTE.

The reference clock signal generation circuit 110 functions as the reference clock signal generation circuit 70 in FIG. 1. Further, the first timer 120 and the memory 140 function as the measurement period setting circuit 10 and the first counter circuit 20 in FIG. 1. The second timer 130 and the memory 140 function as the second counter circuit 30 in FIG. 1. That is, in the microcontroller 100, processing of the reference clock signal generation circuit 70, the measurement period setting circuit 10, the first counter circuit 20, and the second counter circuit 30 in FIG. 1 is performed with hardware by a logic circuit. Meanwhile, at least a part of the processing of the measurement period setting circuit 10, the first counter circuit 20, and the second counter circuit 30 may be performed with software by the CPU 150.

Further, the CPU 150 and the memory 140 function as the first frequency calculation circuit 40, the second frequency calculation circuit 50, the frequency selection circuit 60, and the measurement error calculation circuit in FIG. 1. That is, in the microcontroller 100, processing of the first frequency calculation circuit 40, the second frequency calculation circuit 50, the frequency selection circuit 60, and the measurement error calculation circuit 80 in FIG. 1 is performed with software by the CPU 150. As a result, the microcontroller 100 can easily change the methods of calculating the first frequency $f_1$, calculating the second frequency $f_2$, and selecting the first frequency $f_1$ or the second frequency $f_2$. Meanwhile, at least a part of the processing of the first frequency calculation circuit 40, the second frequency calculation circuit 50, the frequency selection circuit 60, and the measurement error calculation circuit 80 may be performed with hardware by a logic circuit. In this manner, the frequency measurement apparatus 1 can perform at least some of calculation of the first frequency $f_1$ and calculation of the second frequency $f_2$, and selection of the first frequency $f_1$ or the second frequency $f_2$ at high speed.

Figure 6:
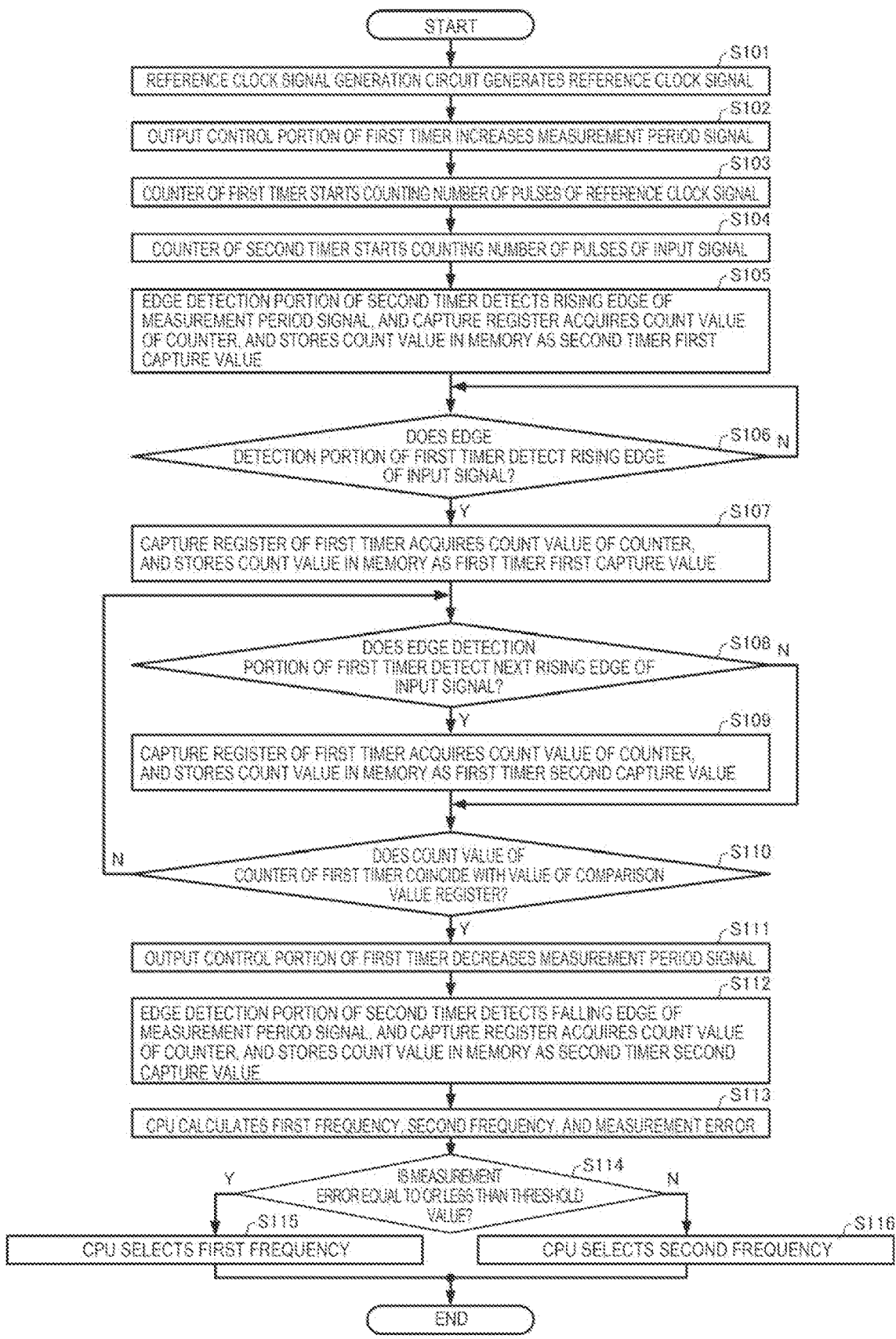
FIG. 6 is a flowchart illustrating an example of an operation procedure of the microcontroller.

FIG. 6 is a flowchart illustrating an example of an operation procedure of the microcontroller 100. As illustrated in FIG. 6, first, the reference clock signal generation circuit 110 generates the reference clock signal CK (step S101).

Next, the output control portion 124 of the first timer 120 increases the measurement period signal TS, and starts the measurement period T (step S102).

Next, the counter 122 of the first timer 120 starts counting the number of pulses of the reference clock signal CK (step S103).

Next, the counter 131 of the second timer 130 starts counting the number of pulses of the input signal IN (step S104).

Next, the edge detection portion 133 of the second timer 130 detects a rising edge of the measurement period signal TS, and the capture register 132 acquires the count value CT2 of the counter 131, and stores the count value CT2 in the memory 140 as the second timer first capture value 143 (step S105).

Next, the edge detection portion 126 of the first timer 120 waits until a rising edge of the input signal IN is detected (N in step S106). When the edge detection portion 126 detects the rising edge of the input signal IN (Y in step S106), the capture register 125 of the first timer 120 acquires the count value CT1 of the counter 122, and stores the count value CT1 in the memory 140 as the first timer first capture value 141 (step S107).

Next, until the count value CT1 of the counter 122 of the first timer 120 coincides with a value of the comparison value register 121 (N in step S110), each time the edge detection portion 126 of the first timer 120 detects the next rising edge of the input signal IN (Y in step S108), the capture register 125 of the first timer 120 acquires the count value CT1 of the counter 122, and stores the count value CT1 in the memory 140 as the first timer second capture value 142 (step S109).

Next, the output control portion 124 of the first timer 120 decreases the measurement period signal TS, and ends the measurement period T (step S111).

Next, the edge detection portion 133 of the second timer 130 detects a falling edge of the measurement period signal TS, and the capture register 132 acquires the count value CT2 of the counter 131, and stores the count value CT2 in the memory 140 as the second timer second capture value 144 (step S112).

Next, the CPU 150 calculates the first frequency $f_1$, the second frequency $f_2$, and the measurement error Err (step S113). Specifically, when the second timer first capture value 143 is set to $n_{T1}$, and the second timer second capture value 144 is set to $n_{T2}$, and $n_{IN}=n_{T2}-n_{T1}$ is set, the CPU 150 calculates the first frequency $f_1$ based on the above Equation (2), by using the frequency $f_R$ of the reference clock signal CK and the number of pulses $n_R$ of the reference clock signal CK during the measurement period T. Further, when the first timer first capture value 141 is set to $n_{E1}$ and the first timer second capture value 142 is set to $n_{E2}$, the CPU 150 calculates the second frequency $f_2$ based on the above Equation (6). In addition, the CPU 150 calculates the measurement error Err based on the above Equation (4).

Finally, when the measurement error Err is equal to or less than the threshold value VTE (Y in step S114), the CPU 150 selects the first frequency $f_1$ as the frequency f of the input signal IN (step S115), and when the measurement error Err is larger than the threshold value VTE (N in step S114), the CPU 150 selects the second frequency $f_2$ as the frequency f of the input signal IN (step S116).

Figure 7:
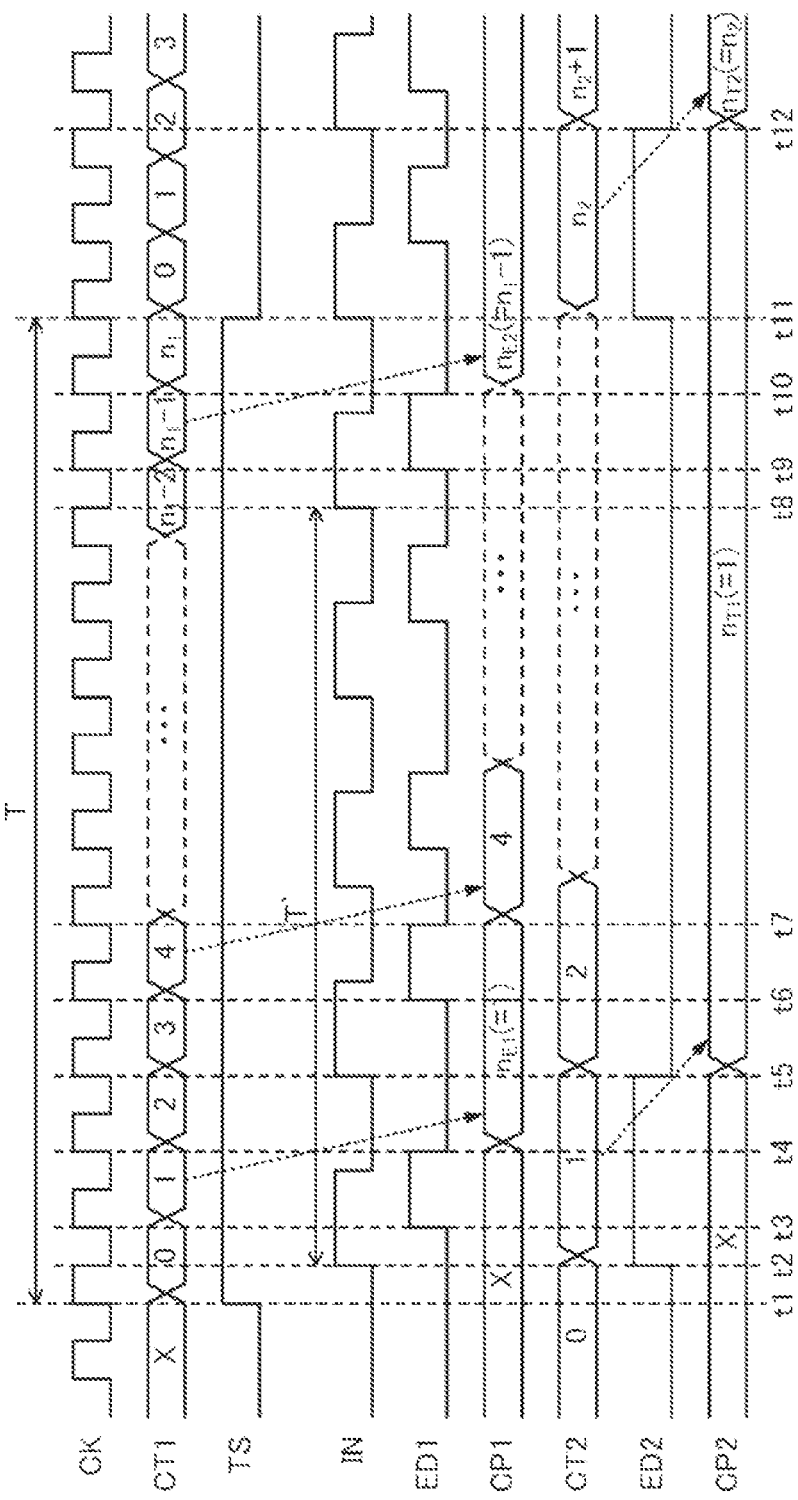
FIG. 7 is a timing chart illustrating an example of waveforms of various signals in the microcontroller.

FIG. 7 is a timing chart illustrating an example of waveforms of various signals in the microcontroller 100.

In the example in FIG. 7, first, at a time t1, the measurement period signal TS transitions from a low level to a high level, and the measurement period T starts. After the count value CT1 of the number of pulses of the reference clock signal CK is reset to 0, the count value CT1 is incremented by 1 from 0 at each rising edge of the reference clock signal CK in the measurement period T.

At a time t2, the input signal IN transitions from a low level to a high level. In synchronization with a rising edge of the input signal IN, the count value CT2 is changed from 0 to 1, and the edge detection signal ED2 transitions from a low level to a high level. Further, the edge detection signal ED1 transitions from a low level to a high level in synchronization with a rising edge of the reference clock signal CK at a time t3.

Since the edge detection signal ED1 is at a high level at a time t4, the capture value CP1 is updated to 1, which is the count value CT1, in synchronization with a rising edge of the reference clock signal CK. The capture value CP1 is stored in the memory 140 as the first timer first capture value 141.

At a time t5, the input signal IN transitions from the low level to the high level. Since the edge detection signal ED2 is at a high level, the capture value CP2 is updated to 1, which is the count value CT2, in synchronization with a rising edge of the input signal IN. The capture value CP2 is stored in the memory 140 as the second timer first capture value 143. Further, the count value CT2 is changed from 1 to 2, in synchronization with the rising edge of the input signal IN. Further, the edge detection signal ED1 transitions from a low level to a high level, in synchronization with a rising edge of the reference clock signal CK at a time t6.

Since the edge detection signal ED1 is at a high level at a time t7, the capture value CP1 is updated to 4, which is the count value CT1, in synchronization with a rising edge of the reference clock signal CK. The capture value CP1 is stored in the memory 140 as the first timer second capture value 142.

After that, until a time t8, in the same manner as the time t5 to the time t7, each time the input signal IN transitions from a low level to a high level, the count value CT2 is incremented by 1 in synchronization with a rising edge of the input signal IN, and the first timer second capture value 142 is updated to the count value CT1, which is the capture value CP1, in synchronization with a rising edge of the reference clock signal CK.

At the time t8, the input signal IN transitions from the low level to the high level, and the edge detection signal ED1 transitions from a low level to a high level, in synchronization with a rising edge of the reference clock signal CK at a time t9.

Since the edge detection signal ED1 is at a high level at a time t10, the capture value CP1 is updated to $n_1-1$, which is the count value CT1, in synchronization with a rising edge of the reference clock signal CK. The capture value CP1 is stored in the memory 140 as the first timer second capture value 142.

Since the count value CT1 coincides with a value $n_1$ of the comparison value register 121 at a time t11, the measurement period signal TS transitions from a high level to a low level, and the measurement period T ends.

Further, the input signal IN transitions from a low level to a high level immediately after the measurement period signal TS transitions from a high level to a low level at a time t11. In synchronization with a rising edge of the input signal IN, the count value CT2 is changed to $n_2$, and the edge detection signal ED2 transitions from a low level to a high level.

At a time t12, the input signal IN transitions from a low level to a high level. Since the edge detection signal ED2 is at a high level, the capture value CP2 is updated to $n_2$, which is the count value CT2, in synchronization with a rising edge of the input signal IN. The capture value CP2 is stored in the memory 140 as the second timer first capture value 143.

When the first timer first capture value 141 is set to $n_{E1}$ and the first timer second capture value 142 is set to $n_{E2}$ after the time t12, $n_{E2}-n_{E1}$ corresponds to the number of pulses of the reference clock signal CK in the period T' from the time t2 to the time t8. Further, when the second timer first capture value 143 is set to $n_{T1}$ and the second timer second capture value 144 is set to $n_{T2}$, $n_{T2}-n_{T1}$ corresponds to the number of pulses of the input signal IN in the measurement period T.

After that, the CPU 150 calculates the first frequency $f_1$ based on the above Equation (2), calculates the second frequency $f_2$ based on the above Equation (6), and calculates the measurement error Err based on the above Equation (4). The first frequency $f_1$ or the second frequency $f_2$ is selected as the frequency f of the input signal IN based on the measurement error Err.

As described above, in the microcontroller 100 according to the present embodiment, the first timer 120 sets the measurement period T of the frequency f of the input signal IN based on the reference clock signal CK, and counts the number of pulses of the reference clock signal CK. Further, the first timer 120 stores the count value CT1 of the number of pulses of the reference clock signal CK at a time of detecting the first rising edge or falling edge of the input signal IN in the measurement period T as $n_{E1}$ in the memory 140. Further, the first timer 120 stores the count value CT1 at a time of detecting the last rising edge or falling edge of the input signal IN in the measurement period T as $n_{E2}$ in the memory 140. In other words, the first timer 120 sets the measurement period T of the frequency f of the input signal IN based on the reference clock signal CK, and counts $n_E=n_{E2}-n_{E1}$ which is the number of pulses of the reference clock signal CK in the period T' based on the input signal IN during the measurement period T.

Further, in the microcontroller 100 according to the present embodiment, the second timer 130 counts the number of pulses of the input signal IN. Further, the second timer 130 stores the count value CT2 of the number of pulses of the input signal IN at a time of detecting the rising edge of the measurement period signal TS as $n_{T1}$ in the memory 140. Further, the second timer 130 stores the count value CT2 at a time of detecting the falling edge of the measurement period signal TS as $n_{T2}$ in the memory 140. In other words, the second timer 130 counts $n_{IN}=n_{T2}-n_{T1}$ which is the number of pulses of the input signal IN during the measurement period T.

Further, in the microcontroller 100 according to the present embodiment, the frequency of the reference clock signal CK is set to $f_R$ and the number of pulses of the reference clock signal CK during the measurement period T is set to $n_R$, and the CPU 150 executes the frequency calculation program 145, so that the first frequency $f_1$ is calculated based on the above Equation (2), the second frequency $f_2$ is calculated based on the above Equation (3) or Equation (6), and the first frequency $f_1$ or the second frequency $f_2$ is selected as the frequency f of the input signal IN.

That is, the microcontroller 100 according to the present embodiment calculates the first frequency $f_1$ by the frequency measurement method, calculates the second frequency $f_2$ by the period measurement method, and selects the first frequency $f_1$ or the second frequency $f_2$ as the frequency of the input signal IN, so that it is possible to widen a frequency measurement range. Further, with the microcontroller 100 according to the present embodiment, the reference clock signal CK is commonly used for the calculation of the first frequency $f_1$ by the frequency measurement method and the calculation of the second frequency $f_2$ by the period measurement method, so that it is possible to reduce a cost without the need for a plurality of clock signals.

Further, in the microcontroller 100 according to the present embodiment, the CPU 150 calculates the measurement error Err by Equation (4) based on the number of pulses $n_{IN}$ of the input signal IN during the measurement period T counted by the second timer 130, and selects the first frequency $f_1$ or the second frequency $f_2$ as the frequency of the input signal IN based on the measurement error Err. Specifically, the CPU 150 selects the first frequency $f_1$ when an absolute value of the measurement error Err is equal to or less than the predetermined threshold value VTE, and selects the second frequency $f_2$ when the absolute value of the measurement error Err is larger than the threshold value VTE. Therefore, with the microcontroller 100 according to the present embodiment, by appropriately setting the threshold value VTE, the CPU 150 can select one having the smaller measurement error of the first frequency $f_1$ and the second frequency $f_2$, so that it is possible to measure the frequency f of the input signal IN with high accuracy.

Further, with the microcontroller 100 according to the present embodiment, the frequency measurement apparatus 1 of measuring the frequency f of the input signal IN can be realized by the versatile first timer 120, the second timer 130, the memory 140, and the CPU 150. Further, with the microcontroller 100 according to the present embodiment, by changing the frequency calculation program 145, the CPU 150 can easily change the methods of calculating the first frequency $f_1$, calculating the second frequency $f_2$, and selecting the first frequency $f_1$ or the second frequency $f_2$.

3. Electronic Apparatus

Figure 8:
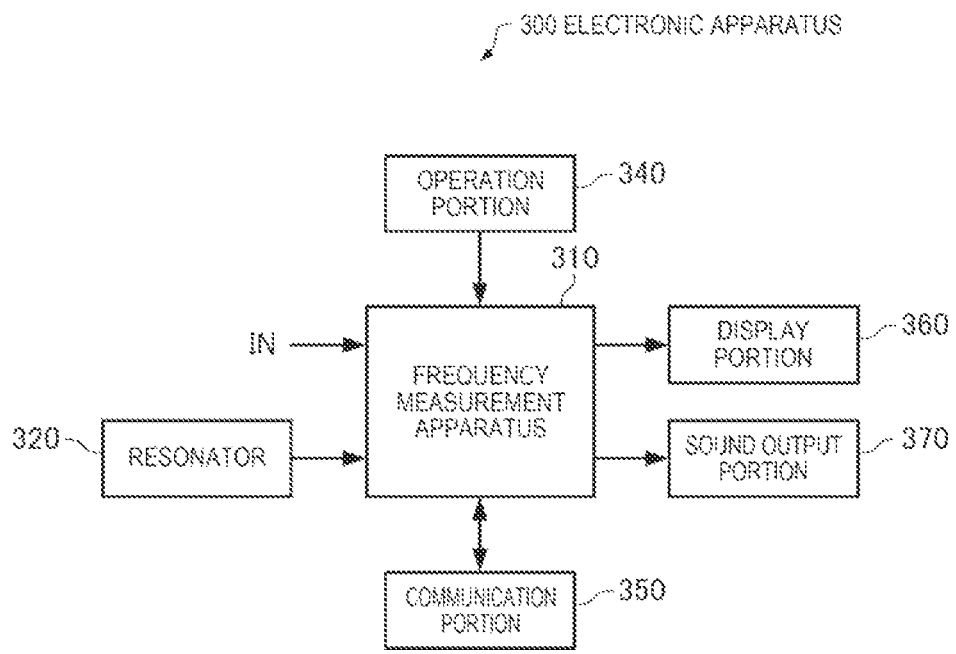
FIG. 8 is a functional block diagram illustrating a configuration example of an electronic apparatus according to the present embodiment.

FIG. 8 is a functional block diagram illustrating a configuration example of an electronic apparatus according to the present embodiment. Further, FIG. 9 is a functional block diagram illustrating another configuration example of the electronic apparatus according to the present embodiment.

Figure 9:
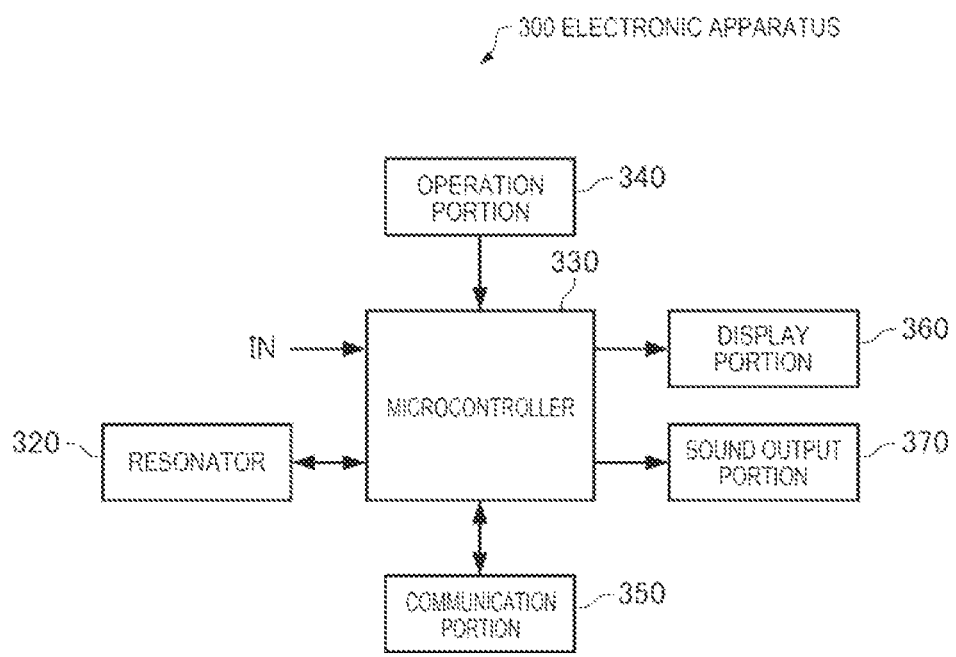
FIG. 9 is a functional block diagram illustrating another configuration example of the electronic apparatus according to the present embodiment.

As illustrated in FIGS. 8 and 9, an electronic apparatus 300 according to the present embodiment has a frequency measurement apparatus 310 or a microcontroller 330. Further, the electronic apparatus 300 according to the present embodiment may include a resonator 320, an operation portion 340, a communication portion 350, a display portion 360, and a sound output portion 370. The electronic apparatus 300 according to the present embodiment may have a configuration in which some of the components in FIG. 8 or 9 are omitted or changed, or other components are added.

The frequency measurement apparatus 310 and the microcontroller 330 perform various calculation processes and control processes according to a program stored in a storage portion (not illustrated). Specifically, the frequency measurement apparatus 310 and the microcontroller 330 perform various processes according to an operation signal from the operation portion 340, a process of controlling the communication portion 350 to perform data communication with other devices, a process of transmitting a display signal for displaying various information on the display portion 360, a process of transmitting a sound signal for outputting various sounds from the sound output portion 370, and the like.

In particular, in the present embodiment, the frequency measurement apparatus 310 and the microcontroller 330 oscillate the external resonator 320 to generate a reference clock signal, and measure the frequency of the input signal IN input from the outside based on the reference clock signal.

The operation portion 340 is an input apparatus configured with operation keys, button switches, and the like, and outputs an operation signal according to an operation by a user to the frequency measurement apparatus 310 or the microcontroller 330.

The communication portion 350 performs various controls for establishing data communication of the frequency measurement apparatus 310 or the microcontroller 330 with the external device.

The display portion 360 is a display apparatus configured with a liquid crystal display (LCD) or the like, and displays various types of information based on the input display signal. The display portion 360 may be provided with a touch panel that functions as the operation portion 340.

The sound output portion 370 is configured with a speaker or the like, and outputs sound based on the sound signal which is an output signal from the frequency measurement apparatus 310 or the microcontroller 330.

By applying, for example, the frequency measurement apparatus 1 according to the embodiment described above as the frequency measurement apparatus 310, or by applying, for example, the microcontroller 100 according to the embodiment described above as the microcontroller 330, it is possible to realize the electronic apparatus 300 having high accuracy for frequency measurement.

Various electronic apparatuses can be considered as such an electronic apparatus 300, and include, for example, a digital multimeter, a vehicle speed sensor, a rotation speed meter, and the like.

Figure 10:
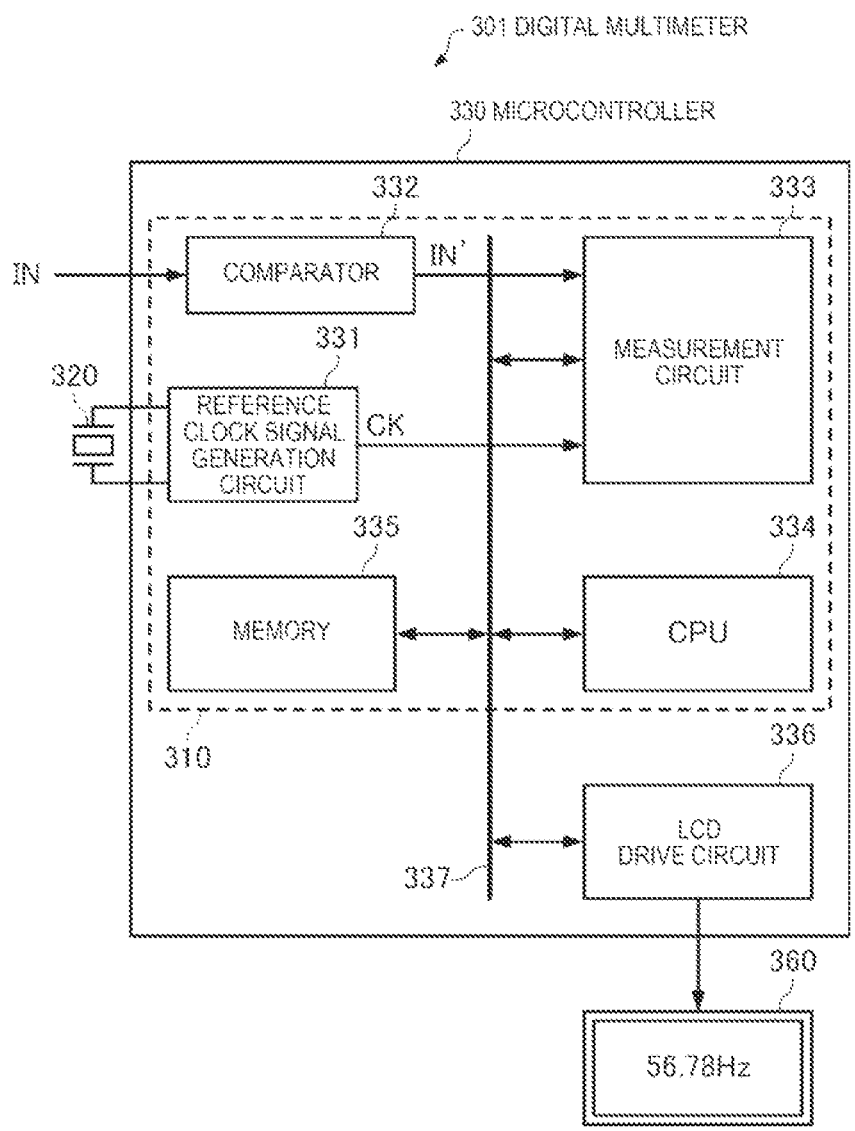
FIG. 10 is a diagram illustrating a configuration example of a digital multimeter as an example of the electronic apparatus.

FIG. 10 is a diagram illustrating a configuration example of a digital multimeter as an example of the electronic apparatus 300. As illustrated in FIG. 10, a digital multimeter 301 has the resonator 320, the microcontroller 330, and the display portion 360 illustrated in FIG. 9.

The microcontroller 330 includes a reference clock signal generation circuit 331, a comparator 332, a measurement circuit 333, a central processing unit (CPU) 334, a memory 335, and an LCD drive circuit 336. The measurement circuit 333, the CPU 334, and the memory 335 are coupled to the bus 337.

The microcontroller 330 is coupled to the resonator 320 such as a quartz crystal resonator, and the reference clock signal generation circuit 331 oscillates the resonator 320 to generate the reference clock signal CK having high frequency accuracy.

The comparator 332 compares the input signal IN such as a sine wave, a triangular wave, and a saw-tooth wave with the reference voltage, and converts the input signal IN into a pulse-shaped input signal IN'.

The measurement circuit 333 counts the number of pulses of the reference clock signal CK for the period T' based on the input signal IN' in the measurement period T set based on the reference clock signal CK, and transfers the count value to the memory 335 via the bus 337 to store the count value. Further, the measurement circuit 333 counts the number of pulses of the input signal IN' during the measurement period T, and transfers the count value to the memory 335 via the bus 337 to store the count value.

The CPU 334 reads various count values from the memory 335 via the bus 337, and calculates the first frequency $f_1$ obtained by the frequency measurement method according to the above Equation (2). Further, the CPU 334 calculates the second frequency $f_2$ obtained by the period measurement method according to the above Equation (3) or Equation (6). In addition, the CPU 334 calculates the measurement error Err based on the above Equation (4). The CPU 334 selects the first frequency $f_1$ or the second frequency $f_2$ as the frequency f of the input signal IN based on the measurement error Err, and transfers the selected frequency to the LCD drive circuit 336 via the bus 337.

The reference clock signal generation circuit 331, the comparator 332, the measurement circuit 333, the CPU 334, and the memory 335 function as the frequency measurement apparatus 310 illustrated in FIG. 8.

The LCD drive circuit 336 drives the display portion 360, which is an LCD, based on the frequency f transferred from the CPU 334 via the bus 337, and generates a display signal for causing the display portion 360 to display information on the frequency f.

The display portion 360 displays the frequency of the input signal IN measured by the frequency measurement apparatus 310, based on the display signal output from the LCD drive circuit 336.

By applying, for example, the frequency measurement apparatus 1 according to the embodiment described above as the frequency measurement apparatus 310, or by applying, for example, the microcontroller 100 according to the embodiment described above as the microcontroller 330, it is possible to realize digital multimeter 301 having high accuracy for frequency measurement.

The reference clock signal generation circuit 331, the CPU 334, and the memory 335 respectively correspond to the reference clock signal generation circuit 110, the CPU 150, and the memory 140 in FIG. 5. Further, the measurement circuit 333 corresponds to the first timer 120 and the second timer 130 in FIG. 5.

The disclosure is not limited to the present embodiment, and various modification examples may be made within the scope of the disclosure.

For example, in the frequency measurement apparatus 1 according to the embodiment described above, the reference clock signal generation circuit 70 oscillates the quartz crystal resonator to generate the reference clock signal CK, and in the microcontroller 100 of the embodiment described above, the reference clock signal generation circuit 110 oscillates the resonator 200 such as a quartz crystal resonator to generate the reference clock signal CK, and the reference clock signal generation circuits 70 and 110 may have other configurations. For example, the reference clock signal generation circuits 70 and 110 may oscillate a piezoelectric resonator, a surface acoustic wave (SAW) resonator, a micro electro mechanical systems (MEMS) resonator, and the like other than a quartz crystal resonator to generate the reference clock signal CK, and may be a CR oscillation circuit.

Further, in the frequency measurement apparatus 1 or the microcontroller 100 according to the embodiment described above, the reference clock signal CK is internally generated, and the reference clock signal CK may be input from the outside of the frequency measurement apparatus 1 or the microcontroller 100.

Further, in the frequency measurement apparatus 1 or the microcontroller 100 according to the embodiment described above, both the first frequency $f_1$ and the second frequency $f_2$ are calculated, and the first frequency $f_1$ may be calculated without calculating the second frequency $f_2$ when the first frequency $f_1$ is selected as the frequency f of the input signal IN, and the second frequency $f_2$ may be calculated without calculating the first frequency $f_1$ when the second frequency $f_2$ is selected as the frequency f of the input signal IN.

The embodiments and modification examples described above are merely examples, and the disclosure is not limited thereto. For example, it is also possible to combine each of the embodiments and each of the modification examples as appropriate.

The present disclosure includes substantially the same configuration as the configuration described in the embodiment (for example, a configuration having the same function, method and result or a configuration having the same object and effect). In addition, the present disclosure includes a configuration in which non-essential parts of the configuration described in the embodiment are replaced. Further, the present disclosure includes a configuration which achieves the same operation and effect as the configuration described in the embodiment or a configuration which can achieve the same object. In addition, the present disclosure includes a configuration in which a known technology is added to the configuration described in the embodiment.

The following contents are derived from the embodiments and modification examples described above.

According to an aspect, there is provided a frequency measurement apparatus which measures a frequency of an input signal, the apparatus including: a measurement period setting circuit that sets a measurement period of the frequency of the input signal based on a reference clock signal; a first counter circuit that counts the number of pulses of the reference clock signal in a period based on the input signal during the measurement period; a second counter circuit that counts the number of pulses of the input signal during the measurement period; a first frequency calculation circuit that calculates a first frequency $f_1$ based on $f_1 = f_R \times n_{IN}/n_R$, where a frequency of the reference clock signal is $f_R$, the number of pulses of the reference clock signal during the measurement period is $n_R$, a count value of the second counter circuit is $n_{IN}$, and a count value of the first counter circuit is $n_E$; a second frequency calculation circuit that calculates a second frequency $f_2$ based on $f_2 = f_R \times n_{IN}/n_E$; and a frequency selection circuit that selects the first frequency $f_1$ or the second frequency $f_2$ as the frequency of the input signal.

In this frequency measurement apparatus, the first frequency calculation circuit calculates the first frequency $f_1$ by a frequency measurement method of counting the number of pulses $n_{IN}$ of the input signal in the measurement period $T = n_R/f_R$, which has a length of $n_R$ times one period of the reference clock signal and measuring the frequency of the input signal. Further, the second frequency calculation circuit calculates the second frequency $f_2$ by a period measurement method of counting the number of pulses $n_E$ of the reference clock signal in a period of counting the number of pulses of the input signal $n_{IN}$ times during the measurement period to measure a time of one period of the input signal, and measuring the frequency of the input signal by using a reciprocal number of the time. The frequency selection circuit selects the first frequency $f_1$ calculated by the frequency measurement method or the second frequency $f_2$ calculated by the period measurement method as the frequency of the input signal, it is possible to widen a frequency measurement range. Further, with the frequency measurement apparatus, the reference clock signal is commonly used for the calculation of the first frequency $f_1$ by the frequency measurement method and the calculation of the second frequency $f_2$ by the period measurement method, so that it is possible to reduce a cost without the need for a plurality of clock signals.

The frequency measurement apparatus according to the aspect, may further include: a measurement error calculation circuit that calculates a measurement error based on the count value of the second counter circuit, in which the frequency selection circuit may select the first frequency $f_1$ or the second frequency $f_2$ as the frequency of the input signal, based on the measurement error.

With the frequency measurement apparatus, the frequency selection circuit selects the first frequency $f_1$ or the second frequency $f_2$ based on the measurement error, so that it is possible to measure the frequency of the input signal with high accuracy.

In the frequency measurement apparatus according to the aspect, the measurement error may be $\pm 1/n_{IN}$.

In the frequency measurement apparatus according to the aspect, the first counter circuit may include a reference count value holding circuit, and in the measurement period, the reference count value holding circuit may sample the input signal with the reference clock signal, detect a rising edge or a falling edge of the input signal, and hold the number of pulses of the reference clock signal from a start time of the measurement period to a detection time of the rising edge or the falling edge of the input signal.

The frequency measurement apparatus according to the aspect, may further include: a reference clock signal generation circuit that generates the reference clock signal.

In the frequency measurement apparatus according to the aspect, processing of the first frequency calculation circuit, the second frequency calculation circuit, and the frequency selection circuit may be performed with software by a CPU.

With the frequency measurement apparatus, it is possible to easily change the methods of calculating the first frequency $f_1$, calculating the second frequency $f_2$, and selecting the first frequency $f_1$ or the second frequency $f_2$.

In the frequency measurement apparatus according to the aspect, processing of the first frequency calculation circuit, the second frequency calculation circuit, and the frequency selection circuit may be performed by a logic circuit.

With the frequency measurement apparatus, it is possible to calculate the first frequency $f_1$ and calculate the second frequency $f_2$, and select the first frequency $f_1$ or the second frequency $f_2$ at high speed.

According to another aspect, there is provided a microcontroller including: the frequency measurement apparatus according to the aspect.

According to still another aspect, there is provided an electronic apparatus including: the frequency measurement apparatus according to the aspect or the microcontroller according to the other aspect.

What is claimed is:

1. A frequency measurement apparatus which measures a frequency of an input signal, the apparatus comprising:
    a measurement period setting circuit that sets a measurement period of the frequency of the input signal based on a reference clock signal;
    a first counter circuit that counts the number of pulses of the reference clock signal in a period based on the input signal during the measurement period;
    a second counter circuit that counts the number of pulses of the input signal during the measurement period;
    a first frequency calculation circuit that calculates a first frequency $f_1$ based on $f_1=f_R \times n_{IN}/n_R$, where a frequency of the reference clock signal is $f_R$, the number of pulses of the reference clock signal during the measurement period is $n_R$, a count value of the second counter circuit is $n_{IN}$, and a count value of the first counter circuit is $n_E$;
    a second frequency calculation circuit that calculates a second frequency $f_2$ based on $f_2=f_R \times n_{IN}/n_E$; and
    a frequency selection circuit that selects the first frequency $f_1$ or the second frequency $f_2$ as the frequency of the input signal.

2. The frequency measurement apparatus according to claim 1, further comprising:
    a measurement error calculation circuit that calculates a measurement error based on the count value of the second counter circuit, wherein
    the frequency selection circuit selects the first frequency $f_1$ or the second frequency $f_2$ as the frequency of the input signal, based on the measurement error.

3. The frequency measurement apparatus according to claim 2, wherein
    the measurement error is $\pm 1/n_{IN}$.

4. The frequency measurement apparatus according to claim 1, wherein
    the first counter circuit includes a reference count value holding circuit, and
    in the measurement period, the reference count value holding circuit samples the input signal with the reference clock signal to detect a rising edge or a falling edge of the input signal, and holds the number of pulses of the reference clock signal from a start time of the measurement period to a detection time of the rising edge or the falling edge of the input signal.

5. The frequency measurement apparatus according to claim 1, further comprising:
    a reference clock signal generation circuit that generates the reference clock signal.

6. The frequency measurement apparatus according to claim 1, wherein
    processing of the first frequency calculation circuit, the second frequency calculation circuit, and the frequency selection circuit are performed with software by a CPU.

7. The frequency measurement apparatus according to claim 1, wherein
    processing of the first frequency calculation circuit, the second frequency calculation circuit, and the frequency selection circuit are performed by a logic circuit.

8. A microcontroller comprising:
    the frequency measurement apparatus according to claim 1.

9. An electronic apparatus comprising:
    the frequency measurement apparatus according to claim 1.

10. An electronic apparatus comprising:
    the microcontroller according to claim 8.

* * * * *